United States Patent [19]

Kashida et al.

[11] Patent Number: 5,234,609
[45] Date of Patent: Aug. 10, 1993

[54] X-RAY PERMEABLE MEMBRANE FOR X-RAY LITHOGRAPHIC MASK

[75] Inventors: Meguru Kashida; Yoshihiko Nagata; Hitoshi Noguchi, all of Gunma, Japan

[73] Assignee: Shin-Etsu Chemical Co., Ltd., Tokyo, Japan

[21] Appl. No.: 899,330

[22] Filed: Jun. 16, 1992

[51] Int. Cl.$^5$ .......................... G21K 5/00; G03F 9/00; C23C 16/00
[52] U.S. Cl. .......................... 252/1; 264/81; 378/35; 427/249; 427/255; 427/160; 430/5
[58] Field of Search .......... 252/1; 264/81; 427/38, 427/39, 255, 255.1, 255.2, 248.1, 249; 430/5; 378/35

[56] References Cited

U.S. PATENT DOCUMENTS

| | | | |
|---|---|---|---|
| 4,436,797 | 3/1984 | Brady et al. | 430/5 |
| 4,735,877 | 4/1988 | Kato et al. | 430/5 |
| 4,804,600 | 2/1989 | Kato et al. | 430/5 |
| 4,877,641 | 10/1989 | Dory | 427/38 |
| 4,877,651 | 10/1989 | Dory | 427/255 |
| 5,005,075 | 4/1991 | Kobayashi et al. | 378/35 |
| 5,042,945 | 8/1991 | Shibata et al. | 356/150 |
| 5,053,255 | 10/1991 | Boeglin | 427/249 |
| 5,061,514 | 10/1991 | Boeglin | 427/39 |
| 5,134,097 | 7/1992 | Nihara et al. | 501/92 |

*Primary Examiner*—Robert L. Stoll
*Assistant Examiner*—Shean C. Wu
*Attorney, Agent, or Firm*—McAulay Fisher Nissen Goldberg & Kiel

[57] ABSTRACT

Disclosed is an X-ray-permeable membrane for X-ray lithographic mask for fine patterning in the manufacture of semiconductor devices having good transparency to visible light and exhibiting excellent resistance against high-energy beam irradiation. The membrane has a chemical composition expressed by the formula $SiC_xN_y$ and can be prepared by the thermal CVD method in an atmosphere of a gaseous mixture consisting of gases comprising, as a group, the elements of silicon, carbon and nitrogen such as a ternary combination of silane, propane and ammonia.

4 Claims, No Drawings

X-RAY PERMEABLE MEMBRANE FOR X-RAY LITHOGRAPHIC MASK

BACKGROUND OF THE INVENTION

The present invention relates to an X-ray permeable membrane for X-ray lithographic mask or, more particularly, to an X-ray permeable membrane for X-ray lithographic mask without defects or pinholes and having excellent smoothness of the surface and high transmissivity of visible light as well as excellent resistance against chemicals and moisture and high-energy beam irradiation.

In recent years, the X-ray lithographic method is highlighted for fine patterning of semiconductor devices in place of the conventional photolithographic method. The X-ray lithographic method is performed by using an X-ray lithographic mask made of a frame-supported X-ray permeable membrane, which is required to satisfy following requirements including, for example, that:

(1) the membrane is made from a material highly resistant and stable against irradiation with high-energy beams such as X-rays, high-energy electron beams, synchrotron orbital radiation, referred to as SOR hereinafter, and the like;

(2) the membrane has a high transmissivity of visible light of at least 50% even when the membrane is thick enough to ensure good mechanical strengths so as to enable high-precision alignment;

(3) the membrane is highly resistant against chemicals and moisture not to be affected or damaged in the manufacturing process of semiconductor devices using an etching solution, rinse and the like;

(4) the membrane has a very smooth surface and is free from any defects such as pinholes; and so on.

Several kinds of materials have been proposed heretofore and are used as a material of the X-ray permeable membrane for X-ray lithographic mask including, for example, boron nitride BN, silicon nitride $Si_3N_4$, silicon carbide SiC and the like. Each of these known materials has its own advantages and disadvantages so that no quite satisfactory material is available in respect of all of the above mentioned requirements for the material.

Among the above mentioned prior art materials, the most promising is silicon carbide and membranes of silicon carbide can be formed by the so-called chemical vapor-phase deposition method, referred to as the CVD method hereinafter, including thermal CVD method, plasma-induced CVD method and others, sputtering method and the like. A silicon carbide membrane formed by the thermal CVD method, in which decomposition of the reactants proceeds by means of thermal energy, has high crystallinity and is highly resistant against high-energy beam irradiation but has a disadvantage that the surface smoothness is very poor so that it can hardly be used as a membrane for the X-ray lithographic mask used in the manufacture of VLSIs which requires a patterning fineness of design rule 0.5 $\mu$m or smaller unless the silicon carbide membrane as formed is subjected to improvement of the surface smoothness by taking a measure such as polishing, etching and the like resulting in a very high cost for the preparation of the X-ray lithographic mask.

Although the surface smoothness and transmissivity to visible light of a silicon carbide membrane can be improved when the membrane is prepared by utilizing the plasma CVD method for the deposition of a silicon carbide film on a substrate, such a silicon carbide membrane necessarily contains a large amount of hydrogen originating in the reactant compounds, for which almost all of known reactant compounds contain hydrogen more or less, which causes a fatal defect that the membrane is poorly resistant against high-energy beam irradiation which causes removal of the hydrogen atoms out of the membrane. Further, silicon carbide membranes prepared by the sputtering method have disadvantages that the transmissivity to visible light thereof is usually low to be about 40% or lower when the membrane has a thickness of 2 $\mu$m and have an amorphous structure susceptible to crystallization so that strain of the membrane is readily caused by the irradiation with high-energy beams such as SOR although the membrane is absolutely free from hydrogen and has excellent smoothness of the surface.

SUMMARY OF THE INVENTION

The present invention accordingly has an object to provide a novel X-ray permeable membrane for X-ray lithographic mask free from the above described problems and disadvantages in the membranes of the prior art.

Thus, the X-ray permeable membrane for X-ray lithographic mask provided by the present invention is a membrane consisting of the elements of silicon, carbon and nitrogen, which is formed by the CVD method from a gaseous compound comprising the elements of silicon, carbon and nitrogen or a combination of gaseous compounds comprising, as a group, the elements of silicon, carbon and nitrogen.

In particular, it is preferable that the membrane has such a chemical composition that the atomic ratio or molar ratio of silicon to the total of carbon and nitrogen is in the range from 0.05 to 2.0 and the atomic ratio of carbon to nitrogen is in the range from 0.2 to 5.0 and the chemical composition is expressed by the formula $SiC_xN_y$, in which the subscript x is a number in the range from 0.25 to 0.86 and the subscript y is a number in the range from 0.18 to 1.0. Further, the membrane is formed preferably by the thermal CVD method. In addition, it is a desirable condition that the content of hydrogen in the membrane does not exceed 1.0 atomic % even when the reactant gas or gases used in the CVD method include a hydrogen-containing compound.

DETAILED DESCRIPTION OF THE PREFERRED EMBODIMENTS

As is described above, silicon carbide membranes prepared by the thermal CVD method are not quite suitable as a material of an X-ray lithographic mask despite their excellent properties in many respects solely due to the poor smoothness of the surface. Accordingly, the inventors have conducted extensive investigations to solve the problem of improving the surface smoothness of a silicon carbide membrane. As a result, the inventors have arrived at a discovery that a silicon carbide membrane having excellent surface smoothness can be obtained by the thermal CVD method when the gaseous atmosphere consisting of a silicon source compound such as dichlorosilane $SiH_2Cl_2$ and a carbon source compound such as propane $C_3H_8$ is admixed with a nitrogen-containing compound such as ammonia $NH_3$ so that the membrane has a chemical composition of the formula $SiC_xN_y$, in which the subscripts x and y are each a positive number.

Further, the membrane prepared in this way has a transmissivity to visible light of 75 to 85% when the membrane has a thickness of 2 μm and contains only about 0.5 atomic % or less of hydrogen despite the use of a hydrogen-containing reactant compound or compounds to exhibit high resistance against high-energy beam irradiation not to cause distortion by the irradiation even though the membrane has an amorphous structure.

As is mentioned above, the X-ray permeable membrane of the invention for X-ray lithographic mask has a chemical composition expressed by the formula $SiC_xN_y$ and is prepared, preferably, by the thermal CVD method from a gaseous compound comprising the elements of silicon, carbon and nitrogen or a combination of compounds comprising, as a group, these three kinds of the elements. Examples of the silicon-containing compound include silane $SiH_4$, dichlorosilane $SiH_2Cl_2$, trichlorosilane $SiHCl_3$, tetrachlorosilane $SiCl_4$ and the like, examples of the carbon-containing compound include methane $CH_4$, propane $C_3H_8$, acetylene $C_2H_2$ and the like and examples of the nitrogen-containing compounds include ammonia $NH_3$, nitrogen $N_2$ and the like. Although the reactant compounds should desirably be gaseous at room temperature, liquid compounds can also be used if the compound can be readily vaporized by bubbling with hydrogen gas or an inert gas or by decreasing the pressure or increasing the temperature.

It is not always necessary that the gaseous atmosphere for the thermal CVD method is formed from a ternary combination of the above mentioned three groups of the compounds but also the atmosphere can be formed by a binary combination of a compound comprising silicon and carbon in a molecule such as methyl trichlorosilane $CH_3SiCl_3$ and a nitrogen-containing compound such as ammonia. It is further possible that the gaseous atmosphere is formed from a single compound comprising the three kinds of the elements in a molecule such as hexamethyl disilazane of the formula $[Si(CH_3)_3]_2NH$. It is preferable, however, that the gaseous atmosphere is formed from a ternary combination of the three kinds of compounds each containing one of the elements of silicon, carbon and nitrogen or from a binary combination of the compounds providing the three kinds of the elements as a group in respect of the versatility in the control of the atomic proportion of the three kinds of the elements in the gaseous atmosphere. When a single compound containing the three kinds of the elements in a molecule is used alone for the gaseous atmosphere, the atomic proportion of the elements in the membrane is necessarily determined by the stoichiometric proportion of the elements in the starting gaseous compound not to give a possibility of freely modifying the atomic proportion of the elements in the membrane.

The procedure of the thermal CVD method, by which the X-ray permeable membrane of the invention is formed, is not particularly limitative and can be conventional. The CVD chamber can be of the normal-pressure or reduced-pressure CVD chamber of the hot-wall type, epitaxial CVD chamber or cold-wall CVD chamber although a reduced-pressure CVD chamber is preferred.

The temperature of the substrate plate in conducting the thermal CVD method should be in the range from 800° to 1500° C. When the temperature is too low, the film deposited on the substrate by the method contains a somewhat increased amount of hydrogen to affect the stability of the membrane against high-energy beam irradiation. When the temperature is too high, the film deposited on the substrate would be subject to crystallization so as to decrease the smoothness of the surface in addition to the problem of an increased amount of foreign materials entering the membrane. Needless to say, the temperature cannot exceed the melting point of the material forming the substrate, which is preferably formed from a high-purity silicon wafer or a fused quartz glass plate.

As is mentioned above, the atmosphere inside of the CVD chamber is formed preferably from a mixture of at least two kinds of gases containing, as a group, the three elements of silicon, carbon and nitrogen. As to the composition of the gaseous mixture forming the atmosphere, it is preferable that the composition of the gaseous atmosphere is formulated in such a way that the molar ratio of Si:(C+N) is in the range from 0.05 to 2.0 and the molar ratio of C:N is in the range from 0.2 to 5.0 in the membrane. When the molar ratio of Si:(C+N) is too small, the excess of the carbon source gas and/or the nitrogen source gas would be discharged as unutilized in addition to the problem of eventual deposition of free carbon to cause a decrease in the light transmission through the membrane. When this molar ratio is too large, free silicon would eventually be deposited also to cause a decrease in the light transmission through the membrane along with a decrease in the surface smoothness. When the molar ratio of C:N is too small, the membrane thus formed would be less resistant against high-energy beam irradiation. When the molar ratio of C:N is too large, on the other hand, the surface of the membrane would have somewhat increased ruggedness.

Further, the content of carbon in the gaseous mixture should be in the range from 5 to 95 atomic % because, when the content of carbon is too small, the membrane thus formed would be poor in the content of SiC so that the radiation resistance of the membrane would be decreased and no improvement can be obtained in the mechanical strengths of the membrane as compared with a membrane of silicon nitride while, when the content of carbon is too large, the properties of the membrane would approximate those of silicon carbide membrane with increased ruggedness of the surface although the membrane would have excellent resistance against high-energy beam irradiation.

The chemical composition of the membrane formed in the above described manner can be expressed by the formula $SiC_xN_y$, in which x is a positive number of 0.25 to 0.86 and y is a positive number of 0.18 to 1.0 provided that the composition of the gaseous mixture for the CVD atmosphere satisfies the above mentioned requirements. When the value of x in the formula is too small or the value of y is too large, the radiation-resistance inherent in a silicon carbide membrane would be lost while, when the value of x is too large of the value of y is too small, the membrane would have increased ruggedness of the surface.

The X-ray permeable membrane of the invention should have a thickness in the range from 0.3 to 3.0 μm. When the thickness is too small, the membrane would have insufficient mechanical strengths while, when the thickness is too large, the membrane would have an increased stress or an insufficient transmissivity to visible light. The thickness should be as uniform as possible to have such a standard deviation that three times of the standard deviation $\sigma$, i.e. $3\sigma$, does not exceed 5% since otherwise the uniformity in the transmissivity to visible light of or the internal stress in the X-ray permeable membrane would be noticeably decreased.

The membrane of the invention should have surface smoothness as high as possible and the surface roughness Ra should not exceed 0.01 $\mu$m or, preferably, 0.005 $\mu$m. When the value of Ra is too large, a problem is caused in the accuracy of the X-ray absorbing pattern formed on the surface of the membrane to prepare an X-ray lithographic mask. The content of hydrogen in the membrane should be 1.0 atomic % or lower as determined by the RBS-HFS method because a membrane containing a larger amount of hydrogen would be less resistant against high-energy beam irradiation. The conventional infrared absorption spectrophotometric method for the determination of the hydrogen content in the membrane is not applicable in this case because of the low sensitivity of the method not to give a measure to ensure such a low hydrogen content of 1.0 atomic % or lower.

The membrane should desirably have a transmissivity to visible light of at least 60% or, preferably, at least 70% even when the membrane has a thickness sufficient to ensure good mechanical strengths because a membrane less transparent to visible light would cause a problem of decreased accuracy of alignment by using visible light. Further, the internal stress in the membrane should be in the range from $1\times10^8$ to $6\times10^9$ dyn/cm$^2$. When the internal stress is too small, a difficulty is caused in processing the film deposited on a substrate into a frame-supported membrane while, when the internal stress is too large, the patterning accuracy of the X-ray lithographic mask would be decreased. The membrane should have such a resistance against high-energy beam irradiation that the change in the internal stress of the membrane is 1% or smaller by the irradiation with high-energy electron beams of 10 keV energy in a dose of 500 MJ/cm$^3$.

In the following, the X-ray permeable membrane of the present invention is described in more detail by way of an example.

EXAMPLE

A 2 mm-thick silicon wafer of 3 inches diameter having a crystallographic plane of (100) was fixedly held by using a carbon-made holder in a fused quartz glass tube as a CVD chamber in a hot-wall type thermal CVD apparatus. The silicon wafer was positioned within the uniform-temperature zone in the furnace which was heated by means of an electric resistance heater.

The CVD chamber was connected to a vacuum line and evacuated to have a pressure of 0.01 Torr and then the temperature of the chamber was increased up to 1000° C. taking 1 hour. A gaseous mixture of silane SiH$_4$, propane C$_3$H$_8$ and ammonia NH$_3$ at flow rates of 77 ml/minute, 20 ml/minute and 200 ml/minute, respectively, was introduced into the chamber while the pressure therein was controlled at 0.5 Torr to conduct the thermal CVD process for 3 hours.

After the end of the above mentioned reaction time, the furnace was cooled to room temperature and the chamber was flushed with nitrogen gas at normal pressure. The silicon wafer was taken out of the chamber and the thin film deposited on the silicon wafer was examined by the RBS method to find that the film had a chemical composition expressed by the formula SiC$_{0.5}$N$_{0.7}$. The film had an average thickness of 1.0 $\mu$m, of which the variation as given by $3\sigma$ was 0.05 $\mu$m and the internal stress therein was $1\times10^9$ dyn/cm$^2$. The content of hydrogen therein was 0.1 atomic % as determined by the RBS-HFS method. The surface of the film was very smooth with roughness Ra of 0.01 $\mu$m or smaller.

The film deposited on the substrate surface was processed into a frame-supported membrane in a conventional manner. Namely, a coating film of boron nitride was formed on the back surface of the silicon wafer by the plasma CVD method and then a 25 mm by 25 mm square area at the center of the boron nitride film was removed by plasma-induced dry-etching method. With the thus formed boron nitride film with the square opening as an etching resist, the silicon wafer in the 25 mm by 25 mm wide unprotected square area was removed by etching with a hot aqueous potassium hydroxide solution leaving the deposited film as a frame-supported membrane. The membrane thus obtained to serve as a mask blank had 80% of light transmission at a wavelength of 633 nm. Further, the membrane was irradiated with high-energy electron beams of 10 keV energy in a dose of 500 MJ/cm$^3$ to find that the membrane was excellently resistant against high-energy beam irradiation with only 1% or smaller of a change in the internal stress by the above mentioned irradiation test.

What is claimed is:

1. An X-ray permeable membrane for an X-ray lithographic mask which is a membrane consisting of the elements of silicon, carbon and nitrogen and which has a chemical composition expressed by the formula SiC$_x$N$_y$, in which the subscript x is a number in the range from 0.25 to 0.86 and the subscript y is a number in the range from 0.18 to 1.0; and hydrogen in an amount not to exceed 1.0 atomic % of the membrane.

2. The membrane of claim 1 having a thickness of from 0.3 to 3.0 $\mu$m.

3. The X-ray permeable membrane for X-ray lithographic mask as claimed in claim 1 in which the molar ratio of silicon to the total of carbon and nitrogen is in the range from 0.05 to 2.0 and the molar ratio of carbon to nitrogen is in the range from 0.2 to 5.0.

4. The X-ray permeable membrane for X-ray lithographic mask as claimed in claim 1 which is formed by the thermal chemical vapor-phase deposition method from a gaseous compound comprising the elements of silicon, carbon and nitrogen or a combination of gaseous compounds comprising, as a group, the elements of silicon, carbon and nitrogen.

* * * * *